(12) United States Patent
Chang et al.

(10) Patent No.: US 10,654,707 B2
(45) Date of Patent: May 19, 2020

(54) METHOD OF STICTION PREVENTION BY PATTERNED ANTI-STICTION LAYER

(71) Applicant: Taiwan Semiconductor Manufacturing Co., Ltd., Hsin-Chu (TW)

(72) Inventors: Kuei-Sung Chang, Kaohsiung (TW); Fei-Lung Lai, New Taipei (TW); Shang-Ying Tsai, Pingzhen (TW); Cheng Yu Hsieh, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/199,461

(22) Filed: Nov. 26, 2018

(65) Prior Publication Data

US 2020/0024124 A1    Jan. 23, 2020

Related U.S. Application Data

(62) Division of application No. 15/665,517, filed on Aug. 1, 2017.

(Continued)

(51) Int. Cl.
*B81B 3/00* (2006.01)
*B81C 1/00* (2006.01)

(52) U.S. Cl.
CPC ............ *B81B 3/0005* (2013.01); *B81B 3/001* (2013.01); *B81C 1/00984* (2013.01);
(Continued)

(58) Field of Classification Search
CPC ......... B81C 1/00269; B81C 2203/0118; B81C 2203/0785; B81C 2203/0792; B81B 3/0005; B81B 2201/112; B81B 3/001
See application file for complete search history.

(56) References Cited

U.S. PATENT DOCUMENTS 5,447,600 A * 9/1995 Webb ................... B05D 5/083
                                                          216/14
9,048,283 B2    6/2015 Liu et al.
(Continued)

FOREIGN PATENT DOCUMENTS

CN    103145088 A    6/2013
CN    103879952 A    6/2014

OTHER PUBLICATIONS

Ex Parte Quayle dated Dec. 10, 2018 for U.S. Appl. No. 15/855,449.
(Continued)

*Primary Examiner* — Matthew L Reames
*Assistant Examiner* — John A Bodnar
(74) *Attorney, Agent, or Firm* — Eschweiler & Potashnik, LLC (57) ABSTRACT

The present disclosure, in some embodiments, relates to a method for manufacturing a MEMS apparatus. The method may be performed by forming an anti-stiction layer on one or more respective surfaces of a handle substrate and a MEMS substrate. The anti-stiction layer is patterned, therein defining a patterned anti-stiction layer that uncovers one or more predetermined locations associated with a bonding of the handle substrate to the MEMS substrate. The handle substrate is bonded to the MEMS substrate at the one or more predetermined locations.

20 Claims, 6 Drawing Sheets

Related U.S. Application Data (60) Provisional application No. 62/527,225, filed on Jun. 30, 2017.

(52) U.S. Cl.
CPC ............... *B81B 2201/0235* (2013.01); *B81B 2201/0242* (2013.01); *B81B 2201/0264* (2013.01); *B81B 2201/0292* (2013.01); *B81C 2201/112* (2013.01); *B81C 2201/115* (2013.01); *B81C 2203/036* (2013.01)

(56) References Cited

U.S. PATENT DOCUMENTS

| | | | |
|---|---|---|---|
| 9,630,834 B2 | 4/2017 | Tayebi et al. | |
| 2004/0100594 A1 | 5/2004 | Huibers et al. | |
| 2007/0082420 A1* | 4/2007 | Milne | B81B 3/001 438/48 |
| 2010/0127339 A1 | 5/2010 | Laermer et al. | |
| 2010/0193884 A1 | 8/2010 | Park | |
| 2010/0291410 A1 | 11/2010 | Novotny et al. | |
| 2010/0314724 A1* | 12/2010 | Hancer | B81C 1/00269 257/632 |
| 2012/0244677 A1 | 9/2012 | Lin et al. | |
| 2013/0015743 A1* | 1/2013 | Tsai | H02N 1/00 310/300 |
| 2014/0353774 A1 | 12/2014 | Zhang et al. | |
| 2014/0374856 A1 | 12/2014 | Chen et al. | |
| 2015/0111332 A1 | 4/2015 | Lee | |
| 2015/0129991 A1 | 5/2015 | Lee et al. | |
| 2015/0158716 A1* | 6/2015 | Cheng | B81B 3/0005 257/254 |
| 2015/0353353 A1 | 12/2015 | Zhang et al. | |
| 2016/0002028 A1 | 1/2016 | Smeys | |
| 2016/0031704 A1 | 2/2016 | Shen et al. | |
| 2016/0207756 A1 | 7/2016 | Chang et al. | |
| 2016/0332863 A1 | 11/2016 | Cheng et al. | |
| 2017/0107097 A1 | 4/2017 | Cheng et al. | |
| 2017/0313573 A1* | 11/2017 | Montez | B81B 3/001 |
| 2018/0057351 A1 | 3/2018 | Yama et al. | |

OTHER PUBLICATIONS

Notice of Allowance dated Feb. 12, 2019 for U.S. Appl. No. 15/855,449.
Maboudian, Roya. "Surface Processes in MEMS Technology." Surface Science Reports 30 (1998) 207-269.
Zhuang, et al. "Vapor Phase Self-assembled Monolayers for Anti-stiction Applications in MEMS." IEEE Journal of Microelectromechanical Systems, 16(6), 1451-1460. Published in 2007.
U.S. Appl. No. 15/855,449, filed Dec. 27, 2017.
Non-Final Office Action dated May 9, 2018 for U.S. Appl. No. 15/665,517.
Final Office Action dated Dec. 23, 2019 for U.S. Appl. No. 15/665,517.

\* cited by examiner

Fig. 14 ically increased or reduced for clarity of
METHOD OF STICTION PREVENTION BY PATTERNED ANTI-STICTION LAYER

REFERENCE TO RELATED APPLICATIONS

This Application is a Divisional of U.S. application Ser. No. 15/665,517, filed on Aug. 1, 2017, which claims priority to U.S. Provisional Application No. 62/527,225, filed on Jun. 30, 2017. The contents of the above-identified patent Applications are hereby incorporated by reference in their entirety.

BACKGROUND

Microelectromechanical systems (MEMS) devices, such as accelerometers, pressure sensors and gyroscopes, have found widespread use in many modern day electronic devices. For example, MEMS accelerometers are commonly found in automobiles (e.g., in airbag deployment systems), tablet computers or in smart phones. For many applications, MEMS devices are electrically connected to application-specific integrated circuits (ASICs) to form complete MEMS systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some micro-electromechanical systems (MEMS) devices, such as accelerometers and gyroscopes, comprise a moveable mass and a neighboring fixed electrode plate arranged within a cavity. The moveable mass is moveable or flexible with respect to the fixed electrode plate in response to external stimuli, such as acceleration, pressure, or gravity. A distance variation between the moveable mass and the fixed electrode plate is detected through the capacitive coupling of the moveable mass and the fixed electrode plate and transmitted to a measurement circuit for further processing.

During the bulk manufacture of MEMS devices according to some methods, a handle substrate (also called a handle wafer) is formed, whereby the handle substrate may be arranged over and bonded to a complementary metal-oxide-semiconductor (CMOS) wafer having supporting logic for the MEMS devices associated therewith. In accordance with one example, a MEMS substrate is further bonded to the handle substrate, and a eutectic bonding substructure may be formed over a surface of the MEMS substrate. In accordance with one exemplary aspect, the MEMS devices are further formed within the MEMS substrate, such as by various patterning methods. Further, a cap wafer may be bonded to the MEMS substrate using the eutectic bonding substructure for eutectic bonding. With the cap substrate bonded to the MEMS substrate, the substrates are singulated into dies, each including at least one MEMS device, and packaging is completed.

Figure 1A:
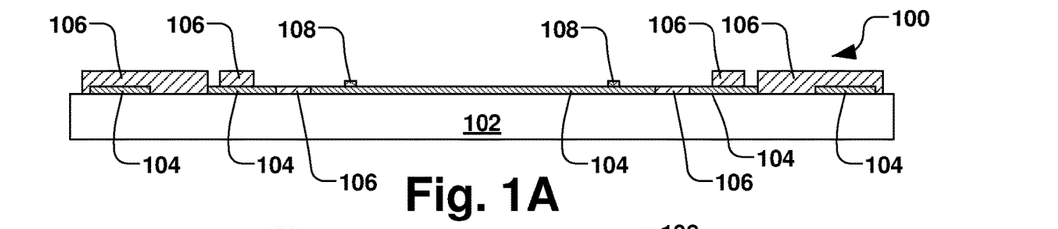
FIG. 1A illustrates a cross-sectional view of some embodiments of a MEMS apparatus handle substrate.

In accordance with one example, FIG. 1A illustrates an exemplary handle substrate 100, wherein the handle substrate comprises a base substrate 102 having a routing metal layer 104 formed and patterned thereon. The routing metal layer 104, for example, may comprise a metal such as aluminum, copper, or other metal. An oxide layer 106 is further formed and patterned over the routing metal layer 104, and a bump feature 108 is further formed over the routing metal layer. The bump feature 108, for example, may be comprised of an oxide, metal, or other material.

Figure 1B:
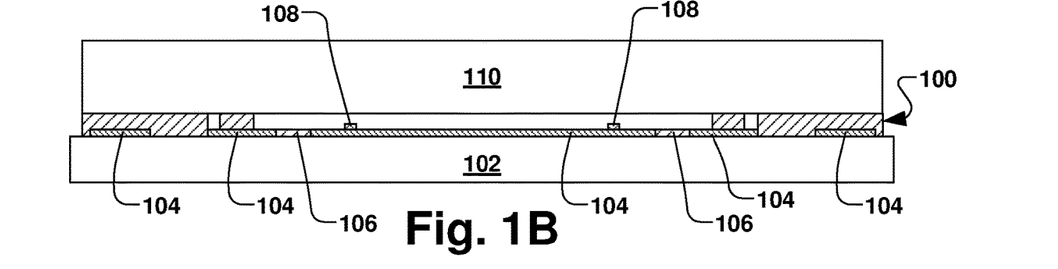
FIG. 1B illustrates a cross-sectional view of some embodiments of a MEMS apparatus handle substrate having a MEMS layer formed thereover.
Figure 1C:
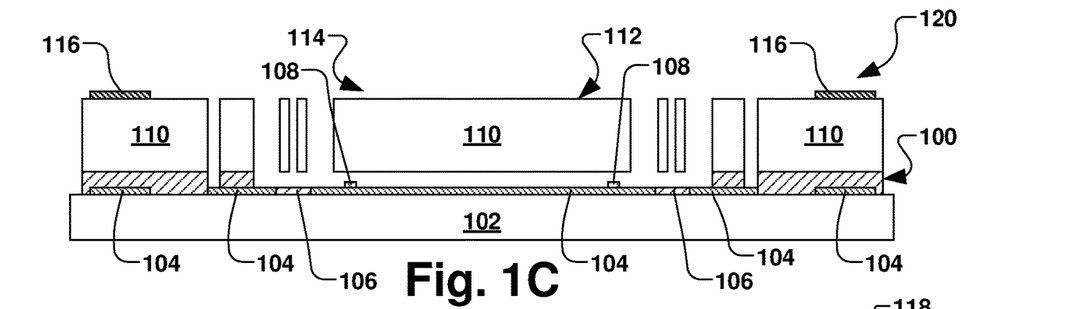
FIG. 1C illustrates a cross-sectional view of some embodiments of a MEMS apparatus handle substrate having a patterned MEMS substrate formed thereover.
Figure 1D:
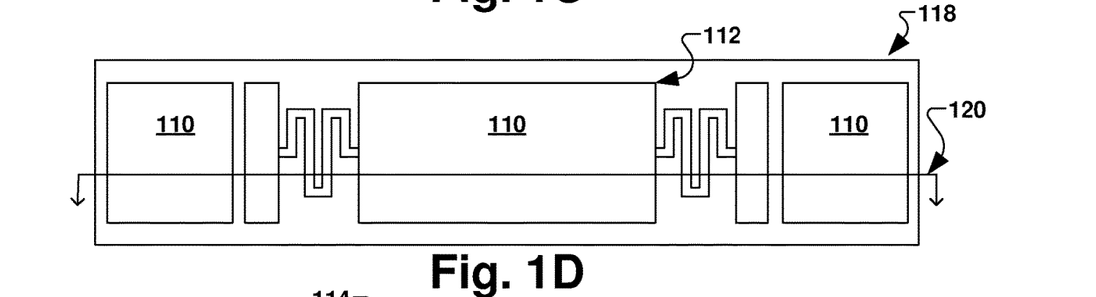
FIG. 1D illustrates a plan view of some embodiments of a MEMS apparatus.

Once the handle substrate 100 is formed, a MEMS substrate 110 is bonded to the handle substrate, such as by fusion bonding, as illustrated in FIG. 1B. The MEMS substrate 110, for example, is further patterned to define a moveable mass 112 of a MEMS device 114, as illustrated in FIG. 1C, and a bonding material layer 116 is formed or otherwise patterned over the MEMS substrate, whereby the bonding material layer may be comprised of a metal such as germanium, aluminum, gold, or other conductive metal. It is further noted that while the bonding material layer 116 may be a metal for eutectic bonding, the bonding material layer may alternatively comprise a non-conductive material configured to act as a bonding material. For example, the bonding material layer 116 may comprise one or more of a polymer to provide adhesive bonding and an oxide to provide fusion bonding. For purposes of clarity, FIG. 1D illustrates a top view 118 of the MEMS device 114, whereby FIG. 1C illustrates a cross-section 120 of the MEMS device. Approaches have been used to attempt to limit surface stiction, for example, performing surface treatment or coating to the moveable mass or cavity surfaces to change hydrophilic properties of the surfaces. However, these approaches are difficult to integrate with various manufacturing processes and introduce contamination.

Due to the moveable or flexible parts, MEMS devices have several production challenges that are not encountered with conventional CMOS circuits. One significant challenge with MEMS devices is surface stiction. Surface stiction refers to the tendency of a moveable or flexible MEMS part to come into contact with a neighboring surface and "stick" to the neighboring surface. This "stiction" can occur at the end of manufacturing, such that the moveable or flexible part is not quite released from the neighboring surface, or can occur during normal operation when the component suddenly becomes "stuck" to the neighboring surface.

Figure 1E:
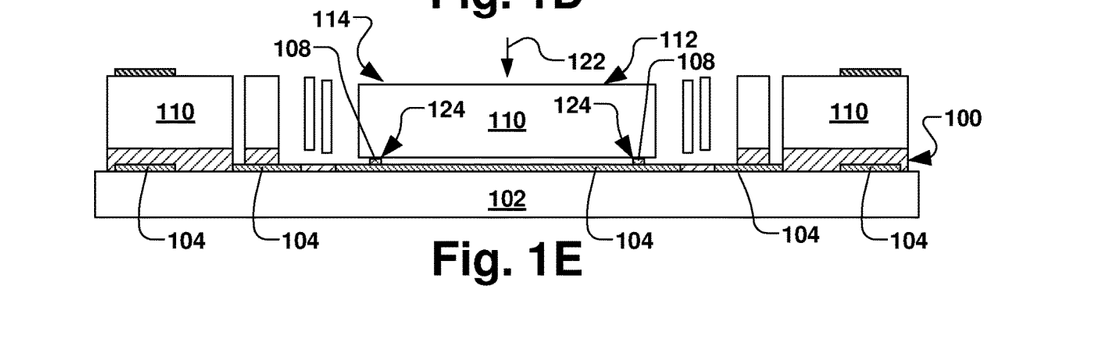
FIG. 1E illustrates a cross-sectional view of some embodiments of a MEMS apparatus upon a force being applied thereto.

For example, FIG. 1E, a movement (shown by arrow 122) of the moveable mass 112 of the MEMS device 114 (e.g., due to acceleration, gravity, pressure, etc.), the moveable mass may contact the bump feature 108, whereby surface stiction may interfere with the ability of the moveable mass to return to its original position. As feature sizes shrink for successive generations of technology, surface stiction is becoming an increasingly important consideration in MEMS devices. Surface stiction can arise due to any one of several different effects, such as capillary force, molecular van der Waals force or electrostatic forces between neighboring surfaces. The extent to which these effects cause stiction can vary based on many different factors such as temperature of the surfaces, contact area between the surfaces, contact potential difference between the surfaces, whether the surfaces are hydrophilic or hydrophobic, and so on.

Figure 2A:
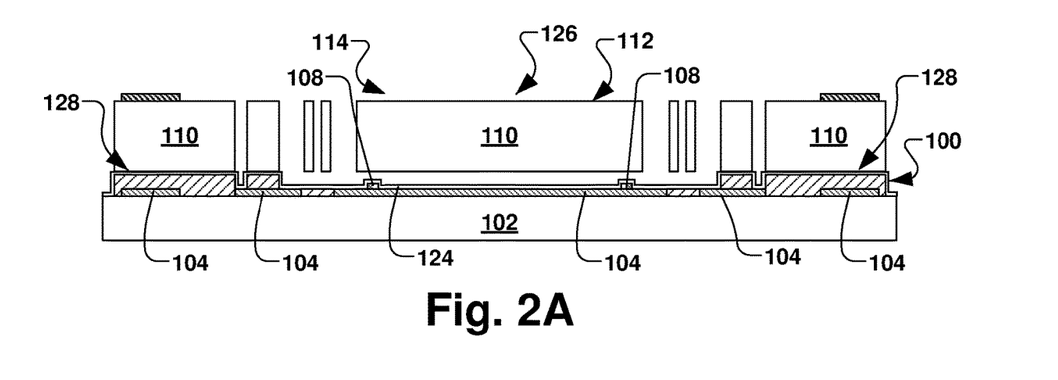
FIG. 2A illustrates a cross-sectional view of some embodiments of a MEMS apparatus with an anti-stiction layer formed over the entire handle substrate.
Figure 2B:
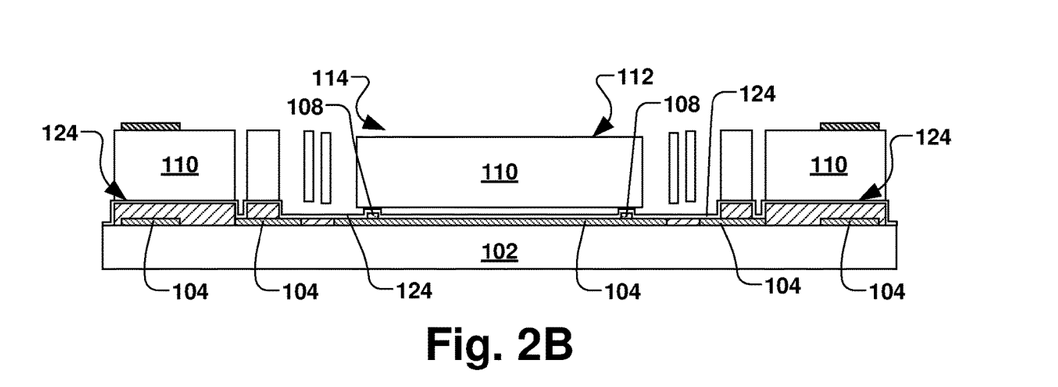
FIG. 2B illustrates a cross-sectional view of some embodiments of the MEMS apparatus of FIG. 2A upon a force being applied thereto.

One way to prevent such stiction between the moveable mass 112 and the bump feature 108 is to form an anti-stiction layer 124 over the handle substrate 100, as illustrated in FIG. 2A. The anti-stiction layer 124, for example, generally inhibits stiction between the moveable mass 112 and the bump feature 108 upon contact of the moveable mass therewith, as illustrated in FIG. 2B, thus permitting the moveable mass to return to its original position 126 of FIG. 2A without stiction. However, conventionally, such an anti-stiction layer 124 coats not only the bump feature 108, but all features and exposed surfaces, such as the routing metal layer 104, oxide layer 106. A challenge with manufacturing MEMS devices according to the foregoing methods, however, pertains to bonding of the MEMS substrate 110 to the handle substrate 100 associated therewith. In applying the anti-stiction layer, all surfaces of the MEMS substrate 110 or handle substrate 100 are coated with the anti-stiction layer 124. However, such an anti-stiction layer 124 reduces the reliability of the bond (e.g., a fusion bond or eutectic bond) in bonding regions 128, thus potentially leading to failure of substrate bonding.

The present application is related to a MEMS apparatus with a patterned anti-stiction layer to improve stiction characteristics and bonding, and associated methods of forming such a MEMS apparatus. The MEMS apparatus of the present disclosure comprises a MEMS substrate bonded to a handle substrate. An anti-stiction layer is disposed on one or more of the MEMS substrate and the handle substrate, wherein the anti-stiction layer comprises a pattern such that the anti-stiction layer is not present at one or more regions associated with an interface between the MEMS substrate and handle substrate. The anti-stiction layer, for example, is patterned on one or more of the handle substrate and MEMS substrate. Therefore, stiction can be avoided at the end of the manufacturing process and/or during normal operation of the MEMS apparatus, and reliability is accordingly improved, while adequate bonding between the MEMS substrate and handle substrate is achieved where desired. The concept will be illustrated herein with regards to some example MEMs devices, but it will be appreciated that the concept is applicable to suitable MEMS device employing moveable parts, including actuators, valves, switches, microphones, pressure sensors, accelerators, and/or gyroscopes, for example.

Figure 3A:
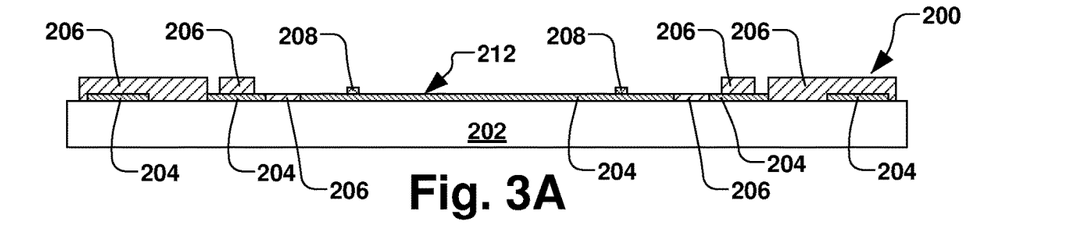
FIGS. 3A-3C illustrate cross-sectional views of various embodiments of a patterning of an anti-stiction layer in a MEMS apparatus.
Figure 3B:
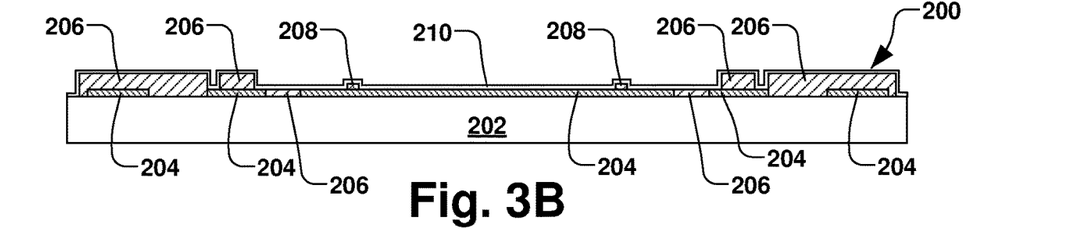
Figure 3C:
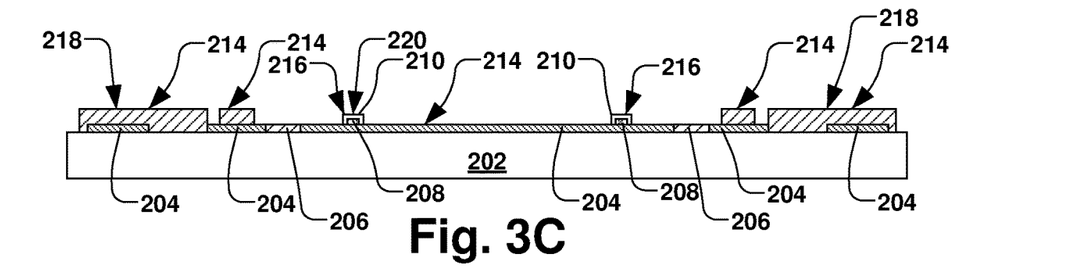

FIGS. 3A-3C illustrate a series of cross-sectional views of some embodiments of a method for manufacturing a MEMS apparatus with a patterned anti-stiction layer at various stages of manufacture.

In accordance with several exemplary aspects of the present disclosure, FIG. 3A illustrates an exemplary handle substrate 200. In accordance with some embodiments, the handle substrate 200 comprises a base substrate 202 having a routing metal layer 204 formed and patterned thereon. The routing metal layer 204, for example, may comprise a metal such as aluminum, copper, or other metal. An oxide layer 206 is further formed and patterned over the routing metal layer 204, and a bump feature 208 is further formed over the routing metal layer 204. The bump feature 208 protrudes outward from an upper surface of the routing metal layer 204. The bump feature 208, for example, may be comprised of an oxide, metal, or other material.

As illustrated in the example shown in FIG. 3B, an anti-stiction layer 210 is formed over a surface 212 (shown in FIG. 3A) of the handle substrate 200. In some embodiments, the anti-stiction layer 210 of FIG. 3B, for example, comprises an organic material that is formed over the surface 212. In some embodiments, the formation of the anti-stiction layer 210 may be accomplished by depositing the organic material in a variety of ways, such as by a deposition of a polymer film, or a monolayer by dipping, spin-coating, sputtering, and chemical vapor deposition (CVD).

As illustrated in FIG. 3C, the anti-stiction layer 210 is patterned, wherein the anti-stiction layer 210 associated with one or more predetermined locations 214 of the handle substrate 200 is removed, thus uncovering the one or more predetermined locations, while maintaining the anti-stiction layer at one or more stiction locations 216. The one or more predetermined locations 214, for example, at least comprise a bonding region 218 associated a bonding of the handle substrate to a MEMS substrate, as will be discussed infra.

In one example, the one or more stiction locations 216 are associated with the bump feature 208. For example, in one embodiment, the anti-stiction layer 210 may be arranged onto an upper surface of the routing metal layer 204 and also along opposing sidewalls and an upper surface of the bump feature 208. In such an embodiment, the anti-stiction layer 210 has lower surfaces that are aligned along a horizontal plane with lower surfaces of the bump feature 208. In another embodiment, the anti-stiction layer 210 may be arranged onto an upper surface of the routing metal layer 204 and also along one sidewall of the bump feature 208 but not along another opposing sidewall. In yet another embodiment, the anti-stiction layer 210 may be arranged onto an upper surface of the routing metal layer 204 and not along sidewalls of the bump feature 208 In another example of the disclosure, the anti-stiction layer 210 is physically etched or abraded in the one or more predetermined locations 214. In another yet another example, the anti-stiction layer is chemically etched in the one or more predetermined locations 214.

In accordance with one embodiment of the present disclosure, the anti-stiction layer 210 is patterned by a photolithographic process. In another embodiment, the anti-stiction layer 210 is patterned by physical or chemical etching using a variety of other techniques via various semiconductor processing techniques, such as dry plasma etching, wet tank etching, or other etching techniques. In some embodiments, wherein the anti-stiction layer 210 is patterned by a photolithographic process, outermost sidewalls of the anti-stiction layer 210 have angled sidewalls. For example, the outermost sidewalls of the anti-stiction layer 210 may have sidewalls that are oriented at an angle of greater than 0° with respect to a normal line perpendicularly extending outward from an upper surface of the routing metal layer 204.

Figure 4:
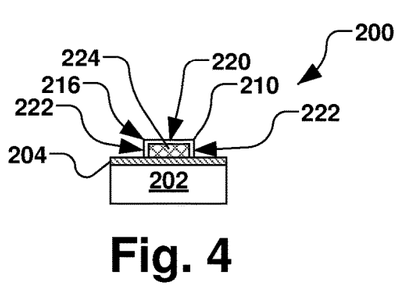
FIGS. 4-6 illustrate cross-sectional views of some embodiments of an enlarged portion of the MEMS apparatus of FIGS. 3A-3C.
Figure 5:
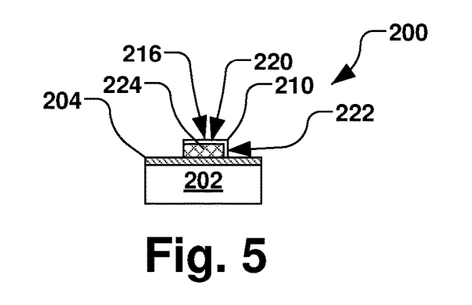
Figure 6:
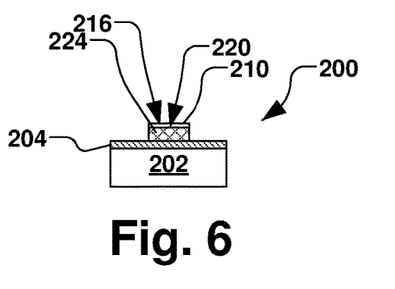

As illustrated in the example shown in FIG. 4, the one or more stiction locations 216 may be associated with a MEMS-facing surface 220 and one or more sidewalls 222 of a handle feature 224 of the handle substrate 200, such as the bump feature 208 shown in FIG. 3C. As illustrated in the example shown in FIG. 5, the one or more stiction locations 216 may be associated with a MEMS-facing surface 220 and one sidewall 222 of the feature 224 of the handle substrate 200. Similarly, as illustrated in the example shown in FIG. 6, the one or more stiction locations 216 may be associated with merely the MEMS-facing surface 220 of the feature 224 of the handle substrate 200. It is noted that while the one or more stiction locations 216 are shown and discussed herein as being associated with one or more of the MEMS-facing surface 220 and sidewalls 222 of features 224 of the handle substrate, it should be appreciated that the one or more stiction locations may be associated with any surface of any of the features 224 described herein.

Figure 7:
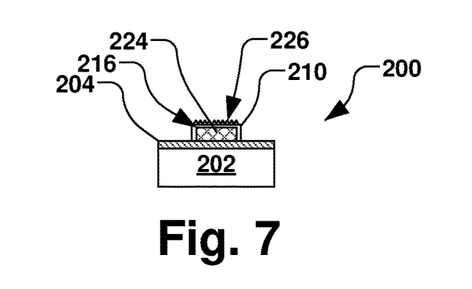
FIG. 7 illustrates a cross-sectional view of some other embodiments of a MEMS apparatus with a roughened patterned anti-stiction layer.

As illustrated in the example, shown in FIG. 7, in yet another embodiment of the present disclosure, the anti-stiction layer 210 may be further roughened at the one or more stiction locations 216. For example, a surface 226 of the anti-stiction layer 210 is roughened either physically or chemically, such as by physical abrasion or treating the surface with a plasma, therein provided a predetermined roughness thereof. Roughening or otherwise modifying the surface 226 of the anti-stiction layer 210, for example, further generally inhibits stiction, as described above. Alternatively, the MEMS-facing surface 220 of feature 224 may be first roughened, whereby the anti-stiction layer 210 may be further deposited on the MEMS-facing surface of the feature.

Is it noted that the present disclosure may be practiced by patterning the anti-stiction layer 210, roughening of the anti-stiction layer, or both patterning and roughing the anti-stiction layer. Alternatively, any surface may be roughened prior to the anti-stiction layer 210 being formed and patterned thereover. As such, combinations of providing either a patterned or roughened anti-stiction layer 210 in one or more stiction locations 216 is contemplated as falling within the scope of the present disclosure.

Figure 8:
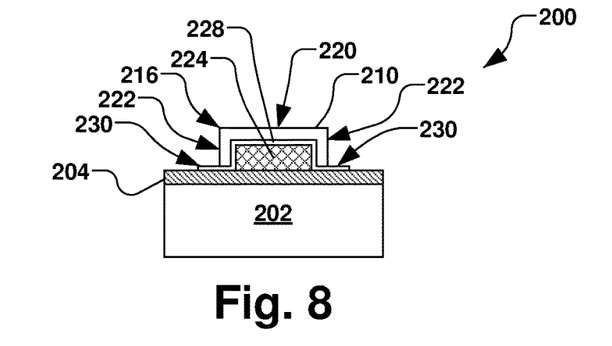
FIGS. 8-9 illustrate cross-sectional views of some embodiments of an enlarged portion of the MEMS apparatus having a conductive metal layer.

In accordance with yet another example embodiment of the present disclosure, FIG. 8 illustrates one of the one or more stiction locations 216, wherein the MEMS-facing surface 220 and one or more sidewalls 222 of the feature 224 of the handle substrate 200 being covered by the anti-stiction layer 210. As shown in FIG. 8, however, a conductive layer 228 is further provided between the feature 224 (e.g., the bump feature 208 shown in FIG. 3C) and the anti-stiction layer 210. In the present embodiment, the conductive layer 228 may comprise a low-resistivity material. For example, the conductive layer 228 may comprise a thin layer of silicon, polysilicon, aluminum, copper, titanium, titanium nitride, or any suitable electrically conductive material. The conductive layer 228, for example, is configured to release and/or disperse any charge build-up in the feature 224 upon contact or proximity to a MEMS feature as discussed above. As illustrated in the example shown in FIG. 8, the one or more stiction locations 216 are associated with a MEMS-facing surface 220 and on sidewall 222 of the feature 224 of the handle substrate 200, whereby the conductive layer 228 comprises a thin conductive layer disposed between the feature and the anti-stiction layer 210.

Figure 9:
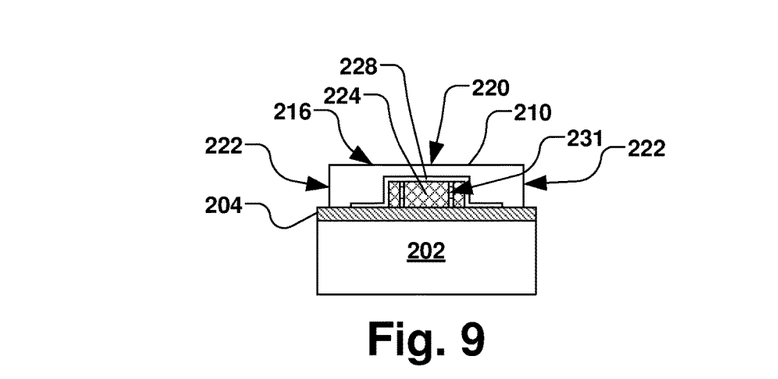

According to another example embodiment, FIG. 9 illustrates another example of the one or more stiction locations 216, wherein the MEMS-facing surface 220 and one or more sidewalls 222 of the feature 224 of the handle substrate 200 are covered by the anti-stiction layer 210. As shown in FIG. 9, the conductive layer 228 described above is further provided between the feature 224 (e.g., the bump feature 208 shown in FIG. 3C) and the anti-stiction layer 210. However, unlike the example shown in FIG. 8 where the conductive layer 228 has portions 230 that are not covered by the anti-stiction layer 210, in the example shown in FIG. 9, the conductive layer 228 is fully encapsulated by the anti-stiction layer 210. FIG. 9 further illustrates an example where a via or via array 231 may be provided within the feature 224 that is further encapsulated by the anti-stiction layer 210. The conductive layer 228, for example, may be formed by a chemical vapor deposition process, such as low pressure chemical vapor deposition (LPCVD), plasma-enhanced chemical vapor deposition (PECVD) or an atmospheric pressure chemical vapor deposition (APCVD) growth process. In some embodiments, the conductive layer 228 may comprise aluminum (Al), nickel (Ni) or copper (Cu).

Figure 10:
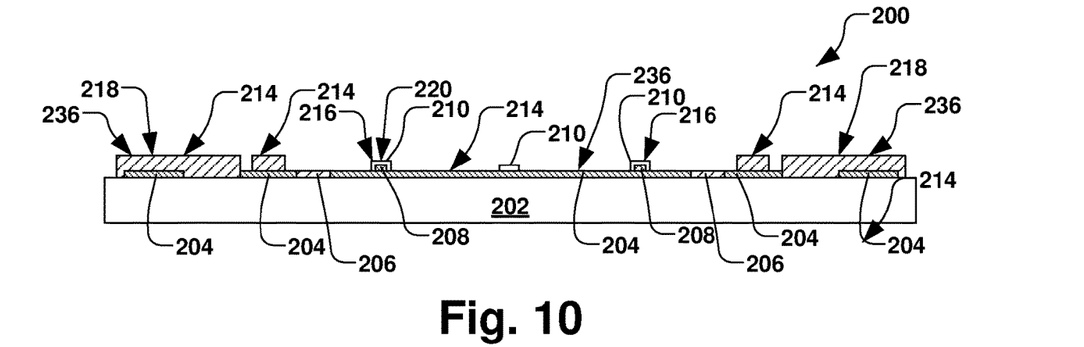
FIGS. 10-11 illustrates a cross-sectional views of some other embodiments of a MEMS apparatus with a patterned anti-stiction layer.
Figure 11:
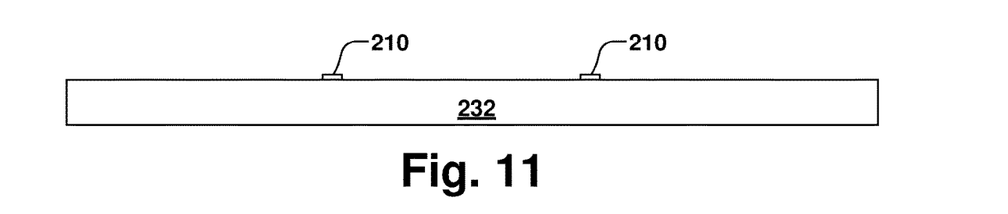

In accordance with another example embodiment shown in FIG. 10, the anti-stiction layer 210 may be provided directly on the routing metal layer 204. In another example, the anti-stiction layer 210 may be provided on the oxide layer 206. Similarly, the anti-stiction layer 210 may be provided on any surface of a handle substrate 200, such as directly on a silicon substrate 232, as illustrated in the example shown in FIG. 11.

Figure 12:
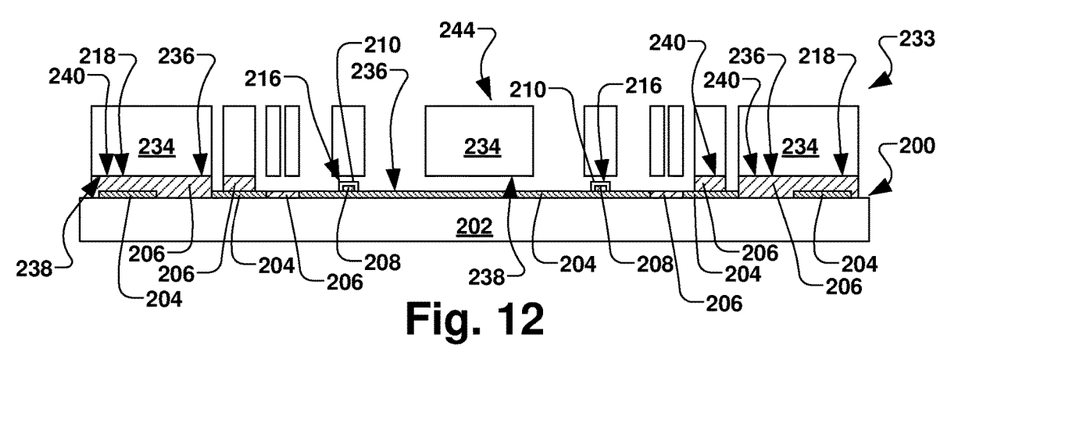
FIGS. 12-13 illustrate cross-sectional views of some embodiments of a method for manufacturing a MEMS apparatus with a patterned anti-stiction layer.

According to another exemplary embodiment of the present disclosure, FIG. 12 illustrates an exemplary MEMS apparatus 233 where a MEMS substrate 234 may be further bonded to the handle substrate 200, such as by fusion bonding of the MEMS substrate to the handle substrate at the one or more bonding regions 218.

For example, the handle substrate 200 of FIG. 10 defines a first bonding face 236, and the MEMS substrate 234 of FIG. 12 defines a second bonding face 238. With the first bonding face 236 facing toward the second bonding face 238, the handle substrate 200 is bonded to the MEMS substrate 234 at a bonding interface 240. The bonding interface 240, for example, is associated with the bonding region 218 of the handle substrate 200. Accordingly, the anti-stiction layer 210 is arranged between the first bonding face 236 and the second bonding face 238 while not residing over the bonding interface 240.

The MEMS substrate 234 may comprise a semiconductor material. For example, in some embodiments, the MEMS substrate 234 may comprise a silicon material such as doped polysilicon. In various embodiments, the MEMS substrate 234 may comprise one or more MEMS devices respectively having a moveable mass that is arranged proximate to the bump features 208. For example, in some embodiments, the MEMS substrate 234 may comprise an accelerometer, a gyroscope, a digital compass, and/or a pressure sensor.

In some embodiments, the handle substrate 200 may comprise active and/or passive semiconductor devices configured to support functionality of the MEMS devices within the MEMS substrate 234. For example, the handle substrate 200 may comprise transistor devices (e.g., MOSFET devices) configured to provide for signal processing of data collected from the MEMs devices within the MEMS substrate 234. In some embodiments (not shown), a back-end-of-the-line (BEOL) metal interconnect stack may be disposed onto an opposing side of the handle substrate 200 as the MEMS substrate 234. The BEOL metal stack comprises a plurality of conductive interconnect layers (e.g., copper and/or aluminum layers) arranged within a dielectric structure arranged along handle substrate 200. The plurality of metal interconnect layers are coupled to the one or more transistor devices. Typically, the plurality of metal interconnect layers comprise metal layers that increase in size as a distance from the semiconductor substrate increases, thereby allowing the one or more transistor devices to be connected to off-chip elements.

In some embodiments, a capping substrate (not shown) may be arranged onto an opposite side of the MEMS substrate 234 as the handle substrate 200. The capping substrate comprises a recess arranged within a surface of the capping substrate facing the MEMS substrate 234. The capping substrate is bonded to the MEMS substrate to form a hermetically sealed cavity that extends between the recess and the handle substrate 200. The hermetically sealed cavity comprises a MEMS device within the MEMS substrate 234 and the bump feature 208 and anti-stiction layer 210. In some embodiments, the cavity may be held at a predetermined pressure that is selected based on a MEMs device that is within the cavity. For example, a pressure within a cavity surrounding an accelerometer may be different than a pressure within a cavity surrounding a gyroscope.

In some embodiments, the capping substrate may comprise a semiconductor material. For example, the capping substrate may comprise a silicon substrate. In some embodiments, the capping substrate may be connected to the MEMS substrate 234 by way of a eutectic bond comprising one or more metal materials.

Figure 13:
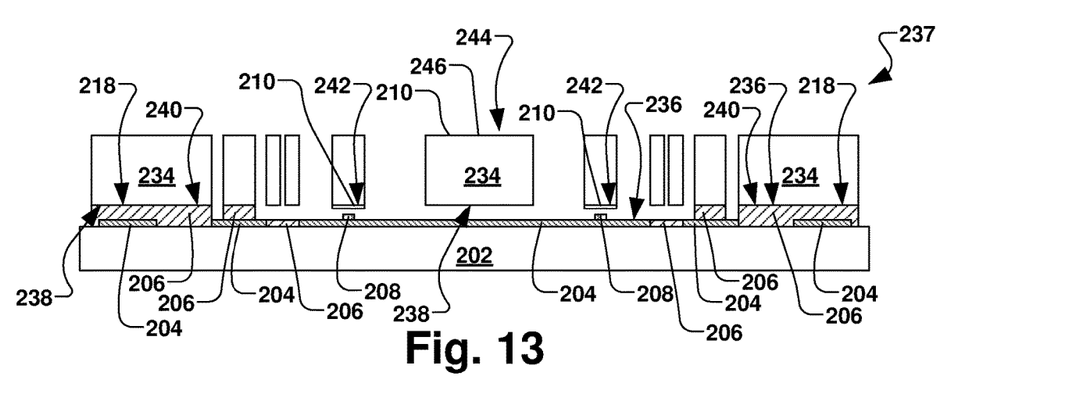

As illustrated in another example embodiment shown in FIG. 13, another exemplary MEMS apparatus 237 is shown wherein the anti-stiction layer 210 may be patterned on a handle-facing surface 242 of the MEMS substrate 234, whereby the anti-stiction layer covers the one or more stiction locations 216 that are associated with the MEMS substrate. Patterning of the anti-stiction layer 210 on the MEMS substrate 234 may be performed as discussed above. It is further noted that conductive materials such as aluminum, titanium or other conductive materials may reside under the anti-stiction layer 210 that is patterned thereover. In some such embodiments, the anti-stiction layer 210 may not be arranged along various surfaces of the handle substrate 200 (e.g., along bump features 208). In other embodiments, the anti-stiction layer 210 may additionally be arranged along surfaces of the handle substrate 200.

The MEMS substrate 234, for example, is patterned to form a MEMS device 244 including a moveable mass 246. The MEMS devices include, for example, micro-actuators or micro-sensors such as a micro-valve, a micro-switch, a microphone, a pressure sensor, an accelerator, a gyroscope or any other device having a moveable or flexible part that moves or flexes with respect to the fixed portion.

Figure 14:
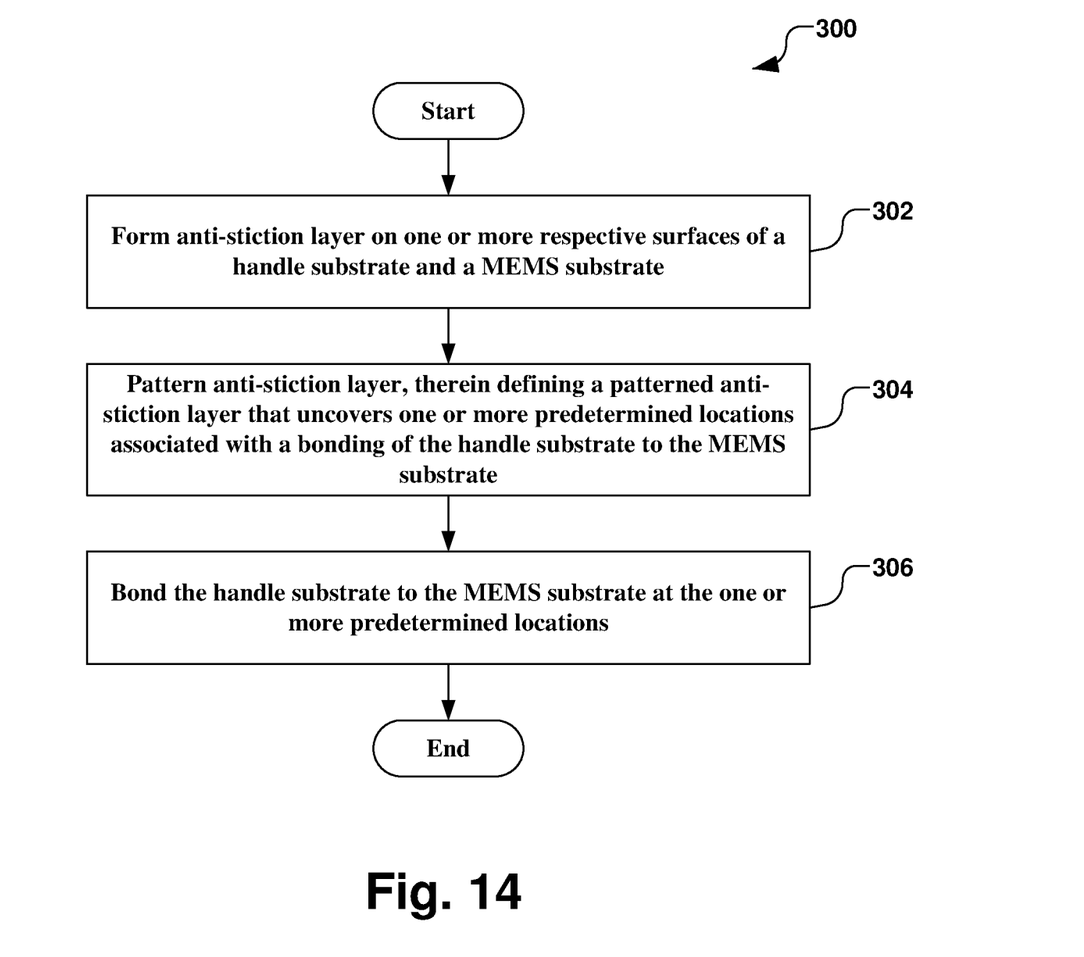
FIG. 14 illustrates a flow diagram of some embodiments of a method for manufacturing a MEMS apparatus with a patterned anti-stiction layer.

FIG. 14 illustrates a flow diagram of some embodiments of a method 300 for manufacturing a MEMS apparatus with a patterned anti-stiction layer in accordance with the present disclosure.

While disclosed method 300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At act 302, an anti-stiction layer is formed or otherwise provided on one or more respective surfaces of a handle substrate and a MEMS substrate. Providing the anti-stiction layer in act 302 may comprise depositing an organic material on the one or more respective surfaces of the handle substrate and MEMS substrate.

In some embodiments, the handle substrate may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, one or more active devices may be formed within the handle structure prior to forming the anti-stiction layer. For example, one or more transistor devices may be formed within the handle substrate using a complementary metal-oxide-semiconductor (CMOS) process. In various embodiments, the organic material may be deposited by way a physical vapor deposition technique (e.g., PVD, CVD, PE-CVD, ALD, etc.). In other embodiments, the organic material may be deposited by way of a spin coating technique.

At act 304, the anti-stiction layer is patterned. In act 304, the patterning of the anti-stiction layer generally defines a patterned anti-stiction layer that uncovers one or more predetermined locations associated with a bonding of the handle substrate to the MEMS substrate. Patterning the anti-stiction layer, for example, may comprise physically removing the organic material from the one or more predetermined locations. Alternatively, patterning the anti-stiction layer may comprise roughening the organic material or the surface on which the organic material is formed at the one or more predetermined locations.

In another alternative example, patterning the anti-stiction layer comprises roughening a surface of the respective handle substrate and MEMS substrate associated with the one or more predetermined locations. For example, patterning the anti-stiction layer may comprise plasma etching the surface of the respective handle substrate and MEMS substrate associated with the one or more predetermined locations. In some embodiments, the plasma etching may have an etching chemistry comprising a fluorine species (e.g., $CF_4$, $CHF_3$, $C_4F_8$, etc.).

In yet another alternative, patterning the anti-stiction layer may comprise performing a photolithographic process on the MEMS substrate and/or the handle substrate. In such an embodiment, a photosensitive layer is formed over the anti-stiction layer 210. In various embodiments, the photosensitive layer may comprise a photoresist layer (e.g., a positive or negative photoresist) formed over the anti-stiction layer by way of a spin coating process. The photosensitive material is subsequently exposed to electromagnetic radiation (e.g., ultra violet light, extreme ultra violet light, etc.) according to a photomask. The electromagnetic radiation modifies a solubility of exposed regions within the photosensitive material to define soluble regions. The photosensitive material is subsequently developed to define a patterned layer of photosensitive material having openings formed by removing the soluble regions. The anti-stiction layer is then etched according to the patterned layer of photosensitive material. In various embodiments, the anti-stiction layer may be selectively the exposed to an etchant in areas not covered by the patterned layer of photosensitive material (e.g., a photoresist layer and/or a hardmask layer). In some embodiments, the etchant may comprise a dry etchant have an etching chemistry comprising a fluorine species (e.g., $CF_4$, $CHF_3$, $C_4F_8$, etc.). In other embodiments, the etchant may comprise a wet etchant comprising hydroflouric acid (HF) or potassium hydroxide (KOH).

In another example, patterning the anti-stiction layer in act 304 may comprise one or more of a physical etch and a chemical etch of the one or more predetermined locations. In some examples, the anti-stiction layer remains over one or more features associated with a MEMS device after patterning.

At act 306, the handle substrate is bonded to the MEMS substrate at the one or more predetermined locations. In various embodiments, the MEMS substrate may comprise one or more MEMS devices respectively comprising a moveable mass. For example, in some embodiments, the MEMs substrate may comprise an accelerometer, a gyroscope, a digital compass, or a pressure sensor. The handle substrate may be bonded to the MEMS substrate so that the movable mass is arranged at a location that is directly over the patterned anti-stiction layer. This allows for the anti-stiction layer to reduce stiction of the moveable mass during operation of a MEMs device.

In one example of the present disclosure, bonding the handle substrate to the MEMS substrate at the one or more predetermined locations comprises fusion bonding the handle substrate to the MEMS substrate at the one or more predetermined locations. In other embodiments, a bonding structure comprising one or more adhesive materials may be used to bond the handle substrate to the MEMS substrate.

In some alternatives of the present disclosure, a conductive layer may be formed over one or more of the handle substrate and MEMS substrate prior to forming the anti-stiction layer in act 304, wherein the conductive layer is positioned between the handle substrate and the MEMS substrate at one or more stiction locations. Forming the conductive layer, for example, may further comprise patterning the conductive layer in one or more regions associated with the one or more stiction locations, wherein the conductive layer contacts a metal layer.

Thus, as can be appreciated from above, the present disclosure relates to a MEMS apparatus with a patterned anti-stiction layer to improve stiction characteristics, and associated methods of forming such a MEMS apparatus.

In one embodiment, the MEMS apparatus comprises a handle substrate defining a first bonding face. A MEMS substrate having a MEMS device defines a second bonding face, wherein the handle substrate is bonded to the MEMS substrate through a bonding interface with the first bonding face toward the second bonding face. An anti-stiction layer is further arranged between the first and the second bonding faces without residing over the bonding interface.

In other embodiments a method for manufacturing a MEMS apparatus is disclosed, wherein an anti-stiction layer is formed on one or more respective surfaces of a handle substrate and a MEMS substrate. The anti-stiction layer is patterned, therein defining a patterned anti-stiction layer that uncovers one or more predetermined locations associated with a bonding of the handle substrate to the MEMS substrate. Further, the handle substrate is bonded to the MEMS substrate at the one or more predetermined locations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a microelectromechanical systems (MEMS) apparatus, the method comprising:
   forming a dielectric layer and a bump feature directly above a conductive routing layer, the bump feature laterally separated from the dielectric layer;
   forming an anti-stiction layer on the dielectric layer and the bump feature;
   patterning the anti-stiction layer to remove the anti-stiction layer from over a part of the conductive routing layer and therein defining a patterned anti-stiction layer that uncovers one or more predetermined locations associated with a bonding of a handle substrate to a MEMS substrate;
   increasing a roughness of an upper surface of the patterned anti-stiction layer; and
   bonding the handle substrate to the MEMS substrate at the one or more predetermined locations.

2. The method of claim 1, wherein forming the anti-stiction layer comprises depositing an organic material on the handle substrate.

3. The method of claim 2, wherein patterning the anti-stiction layer comprises physically removing the organic material from the one or more predetermined locations.

4. The method of claim 1, wherein increasing the roughness of the upper surface of the patterned anti-stiction layer comprises exposing the upper surface of the anti-stiction layer to a chemical or physical treatment.

5. The method of claim 2, wherein patterning the anti-stiction layer comprises one or more of a physical etch and a chemical etch of the one or more predetermined locations.

6. The method of claim 1, wherein increasing the roughness of the upper surface of the patterned anti-stiction layer comprises roughening a substantially flat upper surface of the patterned anti-stiction layer at one or more stiction locations.

7. The method of claim 1, wherein patterning the anti-stiction layer comprises plasma etching a surface of the handle substrate associated with the one or more predetermined locations.

8. The method of claim 1, further comprising forming a conductive layer over the handle substrate prior to forming the anti-stiction layer, wherein the conductive layer is positioned between the handle substrate and the MEMS substrate at one or more stiction locations.

9. The method of claim 8, wherein forming the conductive layer further comprises patterning the conductive layer in one or more regions associated with the one or more stiction locations, wherein the conductive layer contacts a metal layer.

10. A method for manufacturing a microelectromechanical systems (MEMS) apparatus, the method comprising:
    forming a dielectric layer and a bump feature above a conductive routing layer that is over a substrate to define a handle substrate, the bump feature laterally separated from the dielectric layer;
    forming an organic material on one or more surfaces of a MEMS substrate, therein defining an anti-stiction layer on the one or more surfaces of the MEMS substrate;
    patterning the anti-stiction layer, therein defining a patterned anti-stiction layer that removes the anti-stiction layer at one or more predetermined locations associated with a bonding of the handle substrate to the MEMS substrate, wherein a portion of the anti-stiction layer remains on the one or more surfaces of the MEMS substrate after patterning; and
    bonding the handle substrate to the MEMS substrate at the one or more predetermined locations such that the portion of the anti-stiction layer is directly over the bump feature.

11. The method of claim 10, wherein the anti-stiction layer is formed onto a first sidewall, a second sidewall, and an upper surface of the bump feature; and
    wherein patterning the anti-stiction layer removes the anti-stiction layer from the first sidewall of the bump feature, while leaving the patterned anti-stiction layer on the upper surface and the second sidewall of the bump feature.

12. A method for manufacturing a microelectromechanical systems (MEMS) apparatus, the method comprising:
    forming a dielectric layer and a bump feature above a conductive routing layer that is over a substrate to define a handle substrate, the bump feature laterally separated from the dielectric layer;
    forming a separate conductive layer over the bump feature and over the conductive routing layer;
    forming an anti-stiction layer on the handle substrate and directly over the bump feature and the separate conductive layer;
    defining a patterned anti-stiction layer by removing the anti-stiction layer from an upper surface of the dielectric layer, wherein the anti-stiction layer remains over the bump feature and the separate conductive layer after patterning; and
    bonding the upper surface of the dielectric layer to a bonding region of a MEMS substrate.

13. The method of claim 10,
    wherein the anti-stiction layer is formed onto sidewalls and an upper surface of the bump feature; and
    wherein patterning the anti-stiction layer removes the anti-stiction layer from the sidewalls of the bump feature, while leaving the patterned anti-stiction layer on the upper surface of the bump feature.

14. The method of claim 10,
    wherein the anti-stiction layer is formed onto sidewalls and an upper surface of the bump feature; and
    wherein the anti-stiction layer remains on the upper surface and the sidewalls of the bump feature after patterning.

15. The method of claim 12, wherein the anti-stiction layer is formed onto the MEMS substrate prior to bonding the upper surface of the dielectric layer to the bonding region of the MEMS substrate.

16. The method of claim 12, wherein a plane extending along the upper surface of the dielectric layer is above an uppermost surface of the bump feature.

17. The method of claim 12, wherein bonding the upper surface of the dielectric layer to the bonding region of the MEMS substrate comprises bringing the upper surface of the dielectric layer into direct contact with the bonding region of the MEMS substrate.

18. The method of claim 12,
    wherein the anti-stiction layer is formed onto opposing sidewalls and an upper surface of the bump feature; and
    wherein patterning the anti-stiction layer removes the anti-stiction layer from the opposing sidewalls of the bump feature.

19. The method of claim 12, wherein removing the anti-stiction layer removes the anti-stiction layer from a first upper surface of the separate conductive layer, while leaving the patterned anti-stiction layer on a second upper surface of the separate conductive layer.

20. The method of claim 12, wherein removing the anti-stiction layer removes the anti-stiction layer from an upper surface of the conductive routing layer, while leaving the patterned anti-stiction layer on a first upper surface and a second upper surface of the separate conductive layer and laterally extending past opposing outermost sidewalls of the separate conductive layer.

* * * * *